US009369038B2

(12) United States Patent
  Sakai

(10) Patent No.: US 9,369,038 B2
(45) Date of Patent: Jun. 14, 2016

(54) SEMICONDUCTOR INTEGRATED CIRCUIT AND POWER SUPPLY CIRCUIT

(71) Applicant: FUJITSU LIMITED, Kawasaki-shi, Kanagawa (JP)

(72) Inventor: Yasufumi Sakai, Fuchu (JP)

(73) Assignee: FUJITSU LIMITED, Kawasaki (JP)

( * ) Notice: Subject to any disclaimer, the term of this patent is extended or adjusted under 35 U.S.C. 154(b) by 360 days.

(21) Appl. No.: 13/900,635

(22) Filed: May 23, 2013

(65) Prior Publication Data

US 2014/0043009 A1 Feb. 13, 2014

(30) Foreign Application Priority Data

Aug. 8, 2012 (JP) ................................ 2012-175884

(51) Int. Cl.
*G05F 1/40* (2006.01)
*H02M 3/156* (2006.01)
*H01L 27/06* (2006.01)
*H01L 21/8234* (2006.01)
*H01L 27/07* (2006.01)
*H03K 17/16* (2006.01)
(Continued)

(52) U.S. Cl.
CPC ....... *H02M 3/156* (2013.01); *H01L 21/823493* (2013.01); *H01L 27/0629* (2013.01); *H01L 27/0727* (2013.01); *H03K 17/162* (2013.01); *G05F 1/44* (2013.01); *H02M 1/08* (2013.01); *H02M 3/1588* (2013.01); *H03K 2217/0018* (2013.01); *H03K 2217/0063* (2013.01); *Y02B 70/1466* (2013.01)

(58) Field of Classification Search
CPC ....... H02M 3/07; H02M 3/135; H02M 3/137; H02M 3/155; H02M 3/158; G05F 1/40; G05F 1/44; G05F 1/70
See application file for complete search history.

(56) References Cited

U.S. PATENT DOCUMENTS 5,489,870 A    2/1996  Arakawa
7,307,465 B2 * 12/2007  Kobayashi .............. H02M 3/07
                                                      323/313
(Continued)

FOREIGN PATENT DOCUMENTS

JP         6-276729       9/1994
JP       2001-204174      7/2001
(Continued)

OTHER PUBLICATIONS

Texas Instruments, "Low Pin Count, Low $V_{in}$ (2.5 V to 5.5 V) Synchronous Buck DC-to-DC Controller with Enable", pp. 1-38, Mar. 2006.
(Continued)

*Primary Examiner* — Matthew Nguyen
(74) *Attorney, Agent, or Firm* — Fujitsu Patent Center

(57) ABSTRACT

A semiconductor integrated circuit that includes: a capacitive element that has a first end connected to a first node and a second end connected to a second node of higher electrical potential than the first node; and a semiconductor element that has a source electrode, a drain electrode and a gate electrode respectively formed in a second conducting region, the second conducting region being formed with a different conducting type to a first conducting region, and the first conducting region formed on a substrate, with the source electrode and the second conducting region connected to the first node, and the first conducting region connected to the second node.

3 Claims, 11 Drawing Sheets

(51) Int. Cl.
*G05F 1/44* (2006.01)
*H02M 1/08* (2006.01)
*H02M 3/158* (2006.01)

(56) References Cited

U.S. PATENT DOCUMENTS

| | | | |
|---|---|---|---|
| 7,514,908 B2* | 4/2009 | Hosokawa | H02M 3/1588 323/222 |
| 7,863,877 B2* | 1/2011 | Briere | H01L 27/0211 323/222 |
| 2008/0111598 A1 | 5/2008 | Yanagigawa et al. | |
| 2008/0169864 A1 | 7/2008 | Yamahira | |
| 2012/0099232 A1 | 4/2012 | Kuroyabu et al. | |
| 2013/0092930 A1* | 4/2013 | Kimura | G09G 3/3233 257/43 |

FOREIGN PATENT DOCUMENTS

| | | |
|---|---|---|
| JP | 2008-125265 | 5/2008 |
| JP | 2008-198985 | 8/2008 |
| JP | 2011-14738 | 1/2011 |

OTHER PUBLICATIONS

JPOA - Japanese Office Action dated Mar. 22, 2016 for corresponding Japanese Patent Application No. 2012-175884, with partial English translation.

* cited by examiner

US 9,369,038 B2

SEMICONDUCTOR INTEGRATED CIRCUIT AND POWER SUPPLY CIRCUIT

CROSS-REFERENCE TO RELATED APPLICATION

This application is based upon and claims the benefit of priority of the prior Japanese Patent Application No. 2012-175884, filed on Aug. 8, 2012, the entire contents of which are incorporated herein by reference.

FIELD

The embodiments discussed herein are related to a semiconductor integrated circuit and a power supply circuit.

BACKGROUND

In a semiconductor integrated circuit (IC) such as an LSI or VLSI, a power supply circuit (DC-DC converter) is provided to convert an input voltage to a specific direct-current voltage using a step-up circuit to step-up the input voltage or a step-down circuit to step-down the input voltage. There is always some, albeit a small amount of, parasitic capacitance present in transistors configuring an IC. In particular, in transistors having what is referred to as a triple-well structure with an N well (deep N well) provided between a substrate and a P well, parasitic capacitance occurs both between the substrate and the N well and between the N well and the P well.

There is accordingly a proposal for a step-up circuit that employs, in addition to an nMOS transistor employed for charge transport and a node-pumping capacitor, an nMOS transistor for voltage transmission. Such a step-up circuit is formed with an nMOS transistor for P well charge transport and an nMOS transistor for voltage transmission, with the source of the charge transport nMOS transistor connected to the P well through the voltage transmission nMOS transistor. The source voltage of the charge transport nMOS transistor that rises during step-up is accordingly transmitted to the P well, suppressing a back bias effect caused by parasitic capacitance.

There is also a proposal for a step-up circuit employing two N-channel transistors provided between parallel disposed step-up cells, and provided with a low voltage output analogue comparator circuit that outputs the lower voltage out of a first row of step-up cells output voltage and a second row of step-up cells output voltage. In such a step-up circuit, the output terminal of the low voltage output analogue comparator circuit is connected to a transistor of the low voltage output analogue comparator circuit and to each of the N wells of the first row of step-up cells and the second row of step-up cells. The step-up circuit thereby fixes the electrical potential of the N wells of each of the step-up cells to an output electrical potential and reduces the charge-discharge charge amount caused by parasitic capacitance between the N well and the substrate.

Moreover, there is a proposal for a step-up circuit having a charge-pump circuit employing plural capacitors and diodes, wherein a MOS transistor is employed that is formed by a P well on an N well, and the N well of the capacitor is connected to the output terminal. In such a charge-pump circuit, by connecting the N well of the capacitor to the output terminal, a voltage is supplied to the N well of the power supply voltage or above, and so parasitic capacitance between the N well and the P well is made small.

However, in a step-down circuit and a step-up circuit equipped with a high side driver and a transistor employed for switching, a bootstrap capacitor is connected between the power supply side of the high side driver and the source of the switching transistor. An IC provided with such a step-down circuit or step-up circuit is formed either employing a bootstrap capacitor inside the chip or employing a bootstrap capacitor connected to the chip.

However, in a power supply circuit formed with such a step-down circuit or step-up circuit, a drop occurs in the electrostatic capacitance employed for bootstrapping due to the parasitic capacitance arising in the transistors acting as floating capacitance attached to the gates. Thus in such a power supply circuit, the power supply voltage of the high side driver that drives a switching transistor is suppressed. Hence, in a power supply circuit employing a bootstrap capacitor, the electrostatic capacitance of the bootstrap capacitor needs to be made larger in advance to take into consideration the drop caused by parasitic capacitance of the transistor.

RELATED PATENT DOCUMENTS

Japanese Laid-Open Patent Publication No. 06-276729
Japanese Laid-Open Patent Publication No. 2001-204174
Japanese Laid-Open Patent Publication No. 2008-198985
Japanese Laid-Open Patent Publication No. 2008-125265

SUMMARY

According to an aspect of the embodiments, a semiconductor integrated circuit includes: a capacitive element that has a first end connected to a first node and a second end connected to a second node of higher electrical potential than the first node; and a semiconductor element including a source electrode, a drain electrode and a gate electrode respectively formed in a second conducting region, the second conducting region being formed with a different conducting type to a first conducting region, and the first conducting region formed on a substrate, with the source electrode and the second conducting region connected to the first node, and the first conducting region connected to the second node.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Detailed explanation follows regarding an example of technology disclosed herein, with reference to the drawings.

First Exemplary Embodiment

Figure 1:
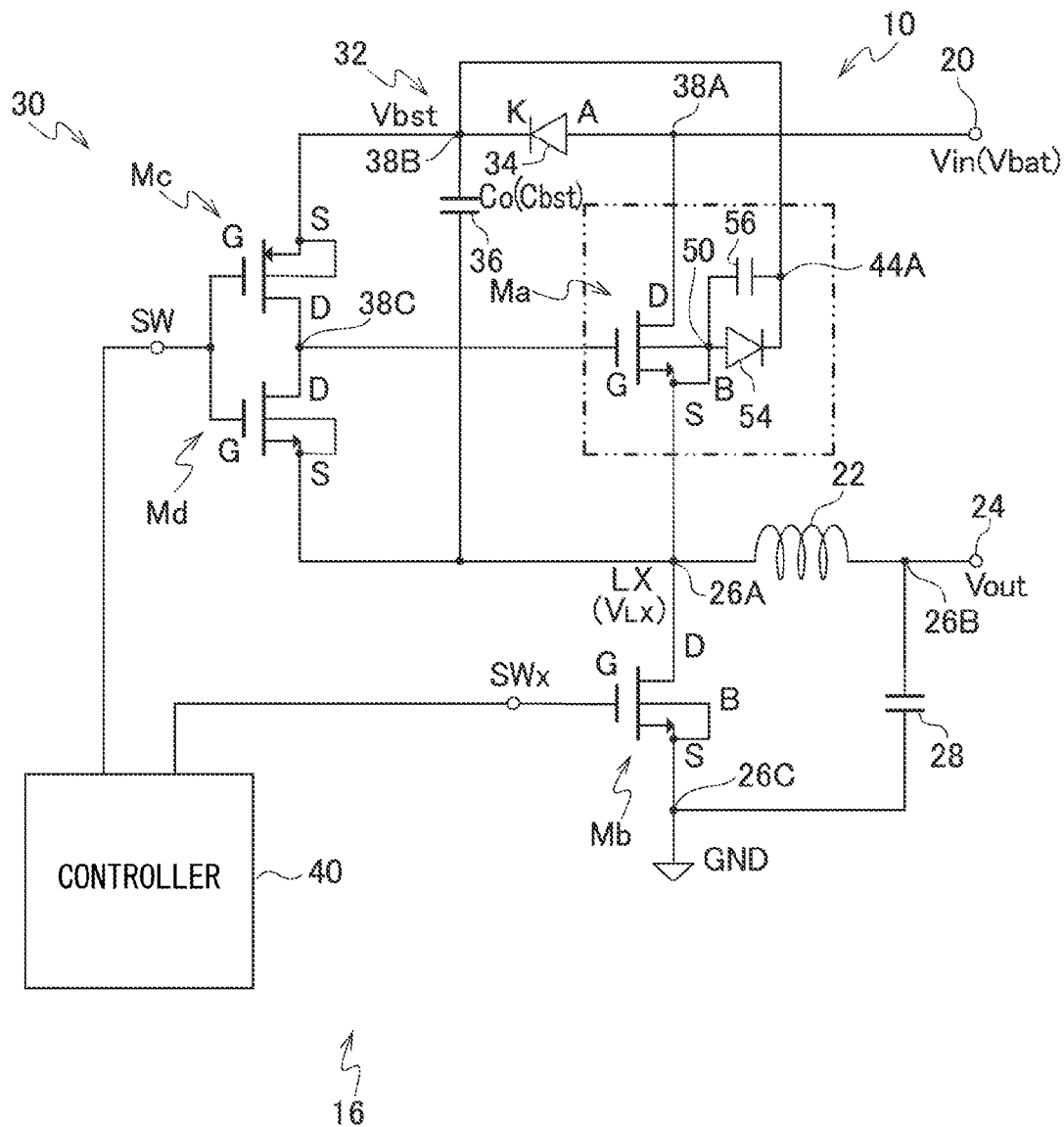
FIG. 1 is a circuit diagram illustrating relevant portions of a step-down circuit according to a first exemplary embodiment.

FIG. 1 illustrates a step-down circuit 10 according to a first exemplary embodiment. The step-down circuit 10 according to the first exemplary embodiment functions as part of a switching DC-DC converter, and on input of a power supply voltage Vin such as a battery voltage Vbat, outputs an output voltage Vout stepped-down from the power supply voltage Vin. The step-down circuit 10 functions as an example of a power supply circuit of technology disclosed herein.

Figure 2A:
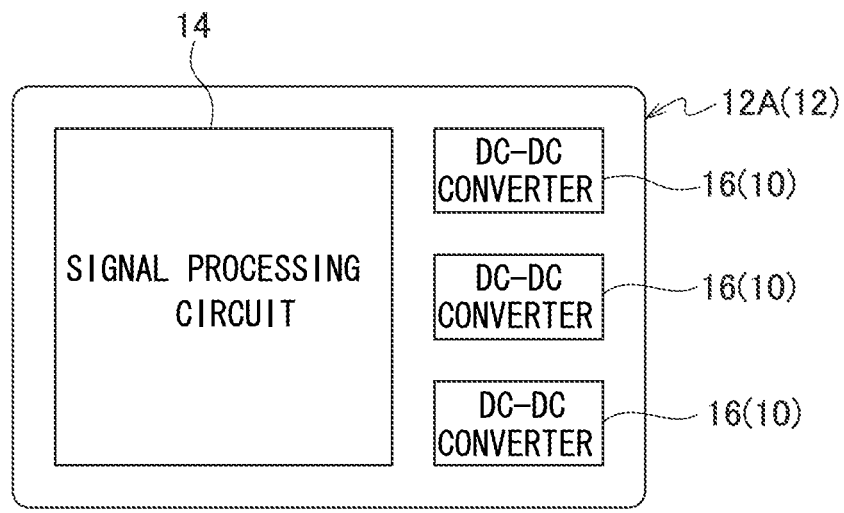
FIG. 2A is a schematic diagram illustrating an example of a step-down circuit provided to a semiconductor integrated circuit.
Figure 2B:
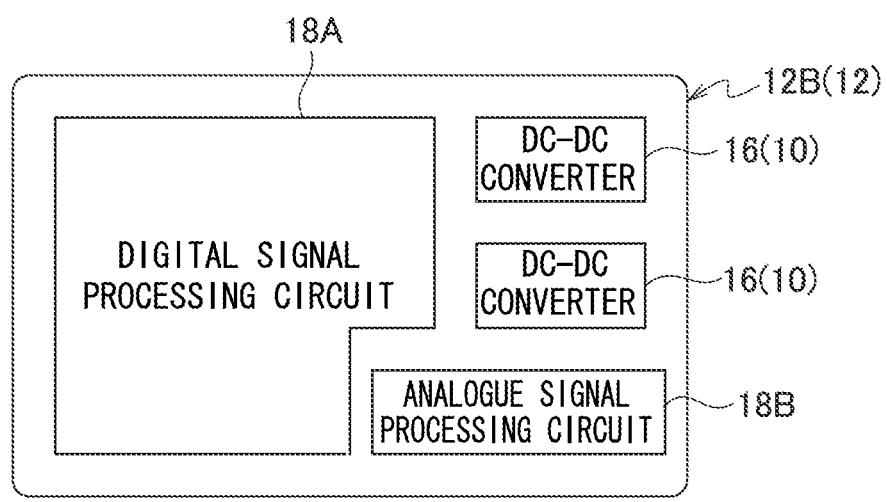
FIG. 2B is a schematic diagram illustrating an example of a step-down circuit provided to a semiconductor integrated circuit.

As illustrated in FIG. 2A and FIG. 2B, the step-down circuit 10 is included in, for example, a semiconductor integrated circuit (referred to below as IC 12) such as a Very Large Scale Integration circuit (VLSI) or a Large Scale Integration circuit (LSI). The IC 12 functions as an example of a semiconductor integrated circuit of technology disclosed herein.

As illustrated in FIG. 2A, the IC 12 may be a power supply IC 12A such as a Power Management Integrated Circuit (PMIC) provided with a signal processing circuit 14 and a DC-DC converter 16. Moreover, as illustrated in FIG. 2B, the IC 12 may be a signal processing IC 12B provided with a digital signal processing circuit 18A, an analogue signal processing circuit 18B and a DC-DC converter 16. The power supply IC 12A and the signal processing IC 12B include one or plural of the DC-DC converters 16. The DC-DC converter 16 functions as an example of a power supply circuit of technology disclosed herein. The step-down circuit 10 includes at least one of the DC-DC converters 16. Note that as illustrated in FIG. 2A and FIG. 2B, as an example the DC-DC converters 16 respectively include the step-down circuit 10.

As illustrated in FIG. 1, the step-down circuit 10 is equipped with a transistor Ma that serves as a high side switch and a transistor Mb that serves as a low side switching element. The transistor Ma functions in the first exemplary embodiment as an example of a semiconductor element and a switching element of the step-down circuit 10. The transistor Mb functions in the first exemplary embodiment as an example of a synchronous rectification element. NMOS transistors are employed for example in the transistors Ma, Mb in the step-down circuit 10.

In the step-down circuit 10, the drain D of the transistor Ma is connected to an input terminal 20, and the source S is connected to an output terminal 24 through an inductor 22. In the step-down circuit 10, the drain D of the transistor Mb is connected to an LX-node 26A between the source S of the transistor Ma and the inductor 22, and the source S is connected to ground (GND). In the present exemplary embodiment, the inductor 22 functions as an example of an inductor, and the LX-node 26A functions as an example of a first node.

The step-down circuit 10 is equipped with a capacitor 28 for smoothing. The capacitor 28 functions as an example of a smoothing capacitive element in the technology disclosed herein. One terminal of the capacitor 28 is connected to a node 26B between the inductor 22 and the output terminal 24, and the other terminal thereof is connected to ground by being connected to a node 26C at the source S side of the transistor Mb.

The step-down circuit 10 accordingly, by ON/OFF driving the transistors Ma, Mb, outputs from the output terminal 24 an output voltage Vout according to a duty ratio of when the transistor Ma is ON and according to a power supply voltage Vin input to the input terminal 20. When this is performed the step-down circuit 10 outputs a direct-current voltage smoothed by the capacitor 28 as the output voltage Vout.

The step-down circuit 10 includes a high side driver circuit (referred to below as driver circuit 30) that drives the transistor Ma and a bootstrap circuit 32. The driver circuit 30 includes a transistor Mc for which a pMOS transistor is employed and a transistor Md for which an nMOS transistor is employed. The bootstrap circuit 32 includes a diode 34 and a bootstrap capacitor 36.

In the first exemplary embodiment, the driver circuit 30 functions as an example of a driver circuit, and the bootstrap circuit 32 functions as an example of a bootstrap circuit. In the first exemplary embodiment, the diode 34 functions as an example of a rectification element and the capacitor 36 functions as an example of a capacitive element.

In the diode 34, the anode A is connected to a node 38A between the drain D of the transistor Ma and the input terminal 20, and the cathode K is connected at a node 38B to one terminal of the capacitor 36. The other terminal of the capacitor 36 is connected to the LX node 26A. The node 38B functions as an example of a second node in the technology disclosed herein. Note that the capacitor 36 may be formed on the IC 12, or may be configured connected to a connection terminal provided to the IC 12.

In the driver circuit 30 the source S of the transistor Mc is connected to the node 38B. In the driver circuit 30 the drain D of the transistor Mc is connected to the drain D of the transistor Md and the source S of the transistor Md is connected to the LX node 26A. Moreover, in the driver circuit 30 the gate G of the transistor Ma is connected to a node 38C between the drain D of the transistor Mc and the drain D of the transistor Md. The driver circuit 30 accordingly functions as an inverter.

In the step-down circuit 10, the capacitor 36 is charged by the power supply voltage Vin input to the input terminal 20, and the charged voltage of the capacitor 36 (the voltage of the node 38B, referred to below as voltage Vbst) is supplied to the driver circuit 30. Namely, in the bootstrap circuit 32 an electrostatic capacitance Cbst arises for bootstrapping according to an electrostatic capacitance Co of the capacitor 36. The driver circuit 30 is supplied by the voltage Vbst arising due to the electrostatic capacitance Cbst.

In the step-down circuit 10, a switching signal SW is input to each of the gates G of the transistors Mc, Md of the driver circuit 30. The step-down circuit 10 inputs the switching signal SWx to the gate G of the transistor Mb on the low side. In the step-down circuit 10 the transistors Ma, Mb are ON/OFF driven based on switching signals SW, SWx. In the step-down circuit 10 the transistors Ma, Mb are driven with complementary signals due to the driver circuit 30 functioning as an inverter. Namely, in the step-down circuit 10, when the transistor Mb is switched ON by the switching signal SWx, the transistor Ma is switched OFF in response to the switching signal SW. Moreover, in the step-down circuit 10, when the transistor Mb is switched OFF by the switching signal SWx, the transistor Ma is switched ON in response to the switching signal SW. Note that in the first exemplary embodiment, as an example, SW=SWx.

The DC-DC converter 16 includes a controller 40. The controller 40 functions as an example of a controller according to technology disclosed herein. The DC-DC converter 16 employs a pulse signal of a specific period and duty ratio as the switching signal SW. The controller 40 outputs the switching signal SW. In the step-down circuit 10, due to operation using the switching signal SW output by the controller 40, the output voltage Vout is output according to the power supply voltage Vin and the duty ratio of the switching signal SW.

Note that the controller 40 outputs, for example, the switching signal SW of a pre-set frequency and duty ratio when the power supply voltage Vin output from, for example, an accumulator is a constant voltage (voltage Vbat). The controller 40 may be configured to perform Pulse Width Modulation (PWM) control to control the duty ratio of the switching signal SW so as to obtain the specific output voltage Vout. The controller 40 may perform Pulse Frequency Modulation (PFM) control to control the frequency of the switching signals SW, SWx so as to obtain the specific output voltage Vout.

Figure 3:
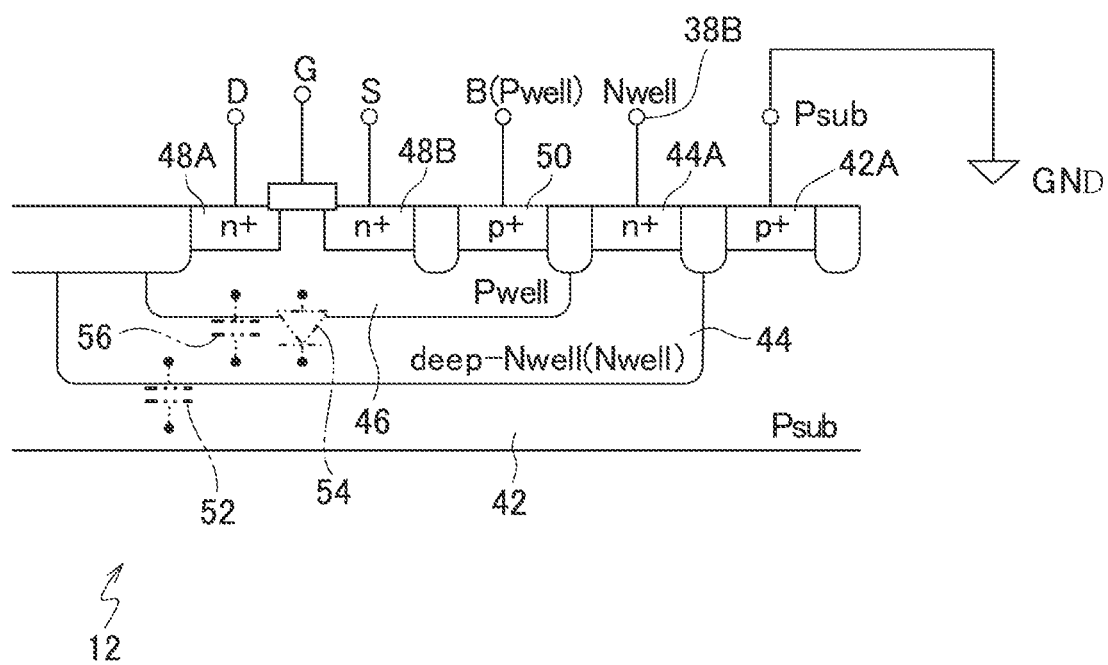
FIG. 3 is a schematic configuration diagram illustrating an example of a triple-well structure.

In the step-down circuit 10 a triple-well structure is applied to the transistor Ma. FIG. 3 illustrates an example of a triple-well structure. The IC 12 includes a P-type substrate (P substrate, referred to below as Psub 42) in which for example a silicon wafer is employed, with an N well (deep N well) 44 formed as an N-type conducting layer in the Psub 42. A P well 46 is also formed as a P-type conducting layer in the N well 44. In the first exemplary embodiment, the transistor Ma is formed as an nMOS transistor in the N well 44. In the present exemplary embodiment, the Psub 42 functions as an example of a substrate, the N well 44 functions as an example of a first conducting region, and the P well 46 functions as an example of a second conducting region. Note that differing conducting types include cases in which one is an N well and the other is a P well.

n+ regions 48A, 48B are formed in the P well 46 to give a drain D and a source S, and a p+ region 50 is formed as a back gate B. Moreover, the gate G of the transistor Ma is formed between the n+ region 48A and the n+ region 48B.

Due to applying the triple-well structure to the transistor Ma, the P well 46 is electrically insulated from P wells and N wells of other transistors formed on the same Psub 42. The IC 12 accordingly prevents noise, generated for example by switching operation of the transistor Ma, propagating to other semiconductor elements such as other transistors on the IC 12.

In the transistor Ma applied with the triple-well structure, pn junctions arise respectively between the Psub 42 and the N well 44 and between the N well 44 and the P well 46. In the transistor Ma a parasitic capacitance (referred to below as capacitor 52) of the parasitic capacitance (electrostatic capacitance) Cjpsub between the Psub 42 and the N well 44 accordingly arises. Moreover, in the transistor Ma a parasitic capacitance (referred to below as capacitance 56) of the parasitic diode (referred to below as diode 54) and the parasitic capacitance (electrostatic capacitance) Cjdnw between the N well 44 and the P well 46 accordingly arises.

In the IC 12, a p+ region 42A of the P sub 42 is connected to ground. Moreover, as illustrated in FIG. 1, the p+ region 50 of the back gate B is connected to the source S of the transistor Ma.

In a triple-well structure, generally the n+ region 44A of the N well 44 would be connected to a power supply line applied with the power supply voltage Vin. However, in contrast thereto, in the step-down circuit 10 the n+ region 44A of the N well 44 of the transistor Ma is connected to the node 38B. In the step-down circuit 10, due to the diode 34 and the capacitor 36 being connected to the node 38B, the voltage Vbst of the node 38B is the power supply voltage Vin of the input terminal 20 or higher, and the electrical potential of the node 38B is higher than the electrical potential of the source S of the transistor Ma.

Accordingly, in the step-down circuit 10 the capacitance 56 arising in the transistor Ma is connected in a parallel state to the capacitor 36 of the bootstrap circuit 32. In the step-down circuit 10, the capacitance (electrostatic capacitance Cjdnw) of the capacitance 56 of the transistor Ma is added to the electrostatic capacitance (Co) of the capacitor 36, and functions as part of the bootstrap electrostatic capacitance (Cbst) in the bootstrap circuit 32.

Explanation follows regarding operation of the first exemplary embodiment. Note that in the following, explanation is given of a case in which pulses output as the switching signals SW, SWx is an H level state, and stopped output of pulses is an L level state.

In the step-down circuit 10, the switching signal SW output from the controller 40 is input to the driver circuit 30, and the switching signal SWx is input to the gate G of the low side transistor Mb. In the driver circuit 30, the transistor Mc is switched OFF and the transistor Md is switched ON by the switching signal SW at H level. When this occurs, the transistor Mb is switched ON by the switching signal SWx.

In the step-down circuit 10, a voltage $V_{LX}$ of the LX node 26A becomes 0V (GND) due to the transistor Mb being ON. In the step-down circuit 10, the transistor Ma is in an OFF state due to the transistor Mc of the driver circuit 30 being OFF and the transistor Md being ON. In this state, the capacitor 36 in the step-down circuit 10 is charged such that the voltage Vbst becomes the power supply voltage Vin due to the node 38B connected to one end of the capacitor 36 becoming the power supply voltage Vin.

In the step-down circuit 10 the transistor Mb is OFF when the switching signal SWx is L level. In the step-down circuit 10, the transistor Mc of the driver circuit 30 is ON and the transistor Md is OFF when the switching signal SW is L level.

Thus in the step-down circuit 10, a voltage is supplied to the source S of the transistor Mc of the driver circuit 30, namely the voltage Vbst is supplied to the gate G of the transistor Ma, making the transistor Ma ON.

In the step-down circuit 10, the voltage $V_{LX}$ of the LX node 26A rises to power supply voltage V in due to the transistor Ma being ON and the transistor Mb being OFF. When this occurs, since in the bootstrap circuit 32 there is no current pulse in the capacitor 36, the voltage Vbst of the node 38B rises to a voltage difference (electrical potential difference) between the two ends of the capacitor 36 with respect to the voltage $V_{LX}$ of the LX node 26A. The ON state in the transistor Ma accordingly continues in the step-down circuit 10.

However, in the step-down circuit 10, current flows in the inductor 22 towards the capacitor 28 due to the transistor Ma being ON, the transistor Mb being OFF, and the voltage $V_{LX}$ of the LX node 26A rising to power supply voltage Vin, thereby charging the capacitor 28. Moreover, in the step-down circuit 10, the voltage $V_{LX}$ falls when the transistor Ma is OFF and the transistor Mb is ON, and electromotive force arising from the accumulated energy in the inductor 22 causes current to flow from the transistor Mb towards the inductor 22.

In the step-down circuit 10, the output voltage Vout is output from the output terminal 24 according to the charging amount of the capacitor 28. The step-down circuit 10 accordingly outputs output voltage Vout according to the power supply voltage Vin and the ON duration (ON duty) of the transistor Ma.

However, in the triple-well structure transistor Ma, the N well 44 is formed in the Psub 42, and the P well 46 is formed in the N well 44. Thus parasitic capacitance arises in the transistor Ma between the Psub 42 and the N well 44 and between the N well 44 and the P well 46. Parasitic capacitance in the transistor Ma including the parasitic capacitance between the Psub 42 and the N well 44 and the N well 44 and the P well 46 acts as floating capacitance attached to the gate G.

In the step-down circuit 10 provided with the bootstrap circuit 32, the floating capacitance attached to the gate G of the transistor Ma influences the electrostatic capacitance Cbst of the bootstrap circuit 32, and a reduction occurs in the electrostatic capacitance Cbst.

Namely, the electrostatic capacitance Cbst of the bootstrap circuit 32 would be the electrostatic capacitance Co of the capacitor 36 except for the influence on the electrostatic capacitance Co of the capacitor 36 from the parasitic capacitance of the transistor Ma. However, due to the parasitic capacitance of the transistor Ma acting as floating capacitance on the gate G, the observed capacitance of the electrostatic capacitance Cbst of the bootstrap circuit 32 is smaller than the electrostatic capacitance Co of the capacitor 36.

A fall in the electrostatic capacitance Cbst of the bootstrap circuit 32 causes a drop in the voltage Vbst supplied from the bootstrap circuit 32 to the driver circuit 30, and is sometimes detrimental to stable operation of the transistor Ma.

Making the electrostatic capacitance Co of the capacitor 36 larger than the needed electrostatic capacitance Cbst in order to secure the electrostatic capacitance Cbst of the bootstrap circuit 32 makes the capacitor 36 larger, and increases the occupied surface area of the capacitor 36 on the IC 12. Moreover, this leads to a larger power supply module when the capacitor 36 is formed as a power supply module connected externally to a chip (the IC 12).

Hence, in the step-down circuit 10, the n+ region 44A of the N well 44 of the triple-well structure transistor Ma is connected to the node 38B that is connected to one end of the capacitor 36 of the bootstrap circuit 32. Moreover, in the bootstrap circuit 32, due to providing the diode 34 between the input terminal 20 and the node 38B, the electrical potential of the node 38B is made to always be higher than the electrical potential of the source S of the transistor Ma.

Consequently, in the step-down circuit 10 the capacitance 56 arising between the N well 44 and the P well 46 of the transistor Ma is in a parallel connected state to the capacitor 36 of the bootstrap circuit 32.

In the step-down circuit 10, the electrostatic capacitance Cjdnw of the capacitance 56 functions as part of the electrostatic capacitance Cbst of the bootstrap circuit 32 due to connecting the capacitance 56 of the transistor Ma in parallel to the capacitor 36 of the bootstrap circuit 32. Note that in the transistor Ma, the electrostatic capacitance Cjpsub of the capacitor 52 between the Psub 42 and the N well 44 functions to reduce the electrostatic capacitance Cjdnw of the capacitance 56 due to the Psub 42 being connected to ground. However, the electrostatic capacitance Cjdnw functions as part of the electrostatic capacitance Cbst of the bootstrap circuit 32 when the electrostatic capacitance Cjdnw of the capacitance 56 is larger than the electrostatic capacitance Cjpsub of the capacitor 52.

In the step-down circuit 10, the electrostatic capacitance Cjdnw that is part of the parasitic capacitance of the transistor Ma is employed as the electrostatic capacitance Cbst of the bootstrap circuit 32. The step-down circuit 10 thus enables the electrostatic capacitance Cbst of the bootstrap circuit 32 to be increased without increasing the electrostatic capacitance Co of the capacitor 36. Moreover, the step-down circuit 10 is able to achieve a reduction in the floating capacitance attached to the gate G of the transistor Ma, thereby enabling lowering of the electrostatic capacitance Cbst of the bootstrap circuit 32 to be suppressed.

The step-down circuit 10 accordingly enables stable operation to be achieved without making the capacitor 36 of the bootstrap circuit 32 larger. The step-down circuit 10 moreover enables enhanced voltage conversion efficiency to be achieved.

In the first exemplary embodiment, the transistor Mb is employed as a synchronous rectification element, however a synchronous rectification element of the step-down circuit 10 of technology disclosed herein is not limited to a switching element such as a transistor.

Figure 4:
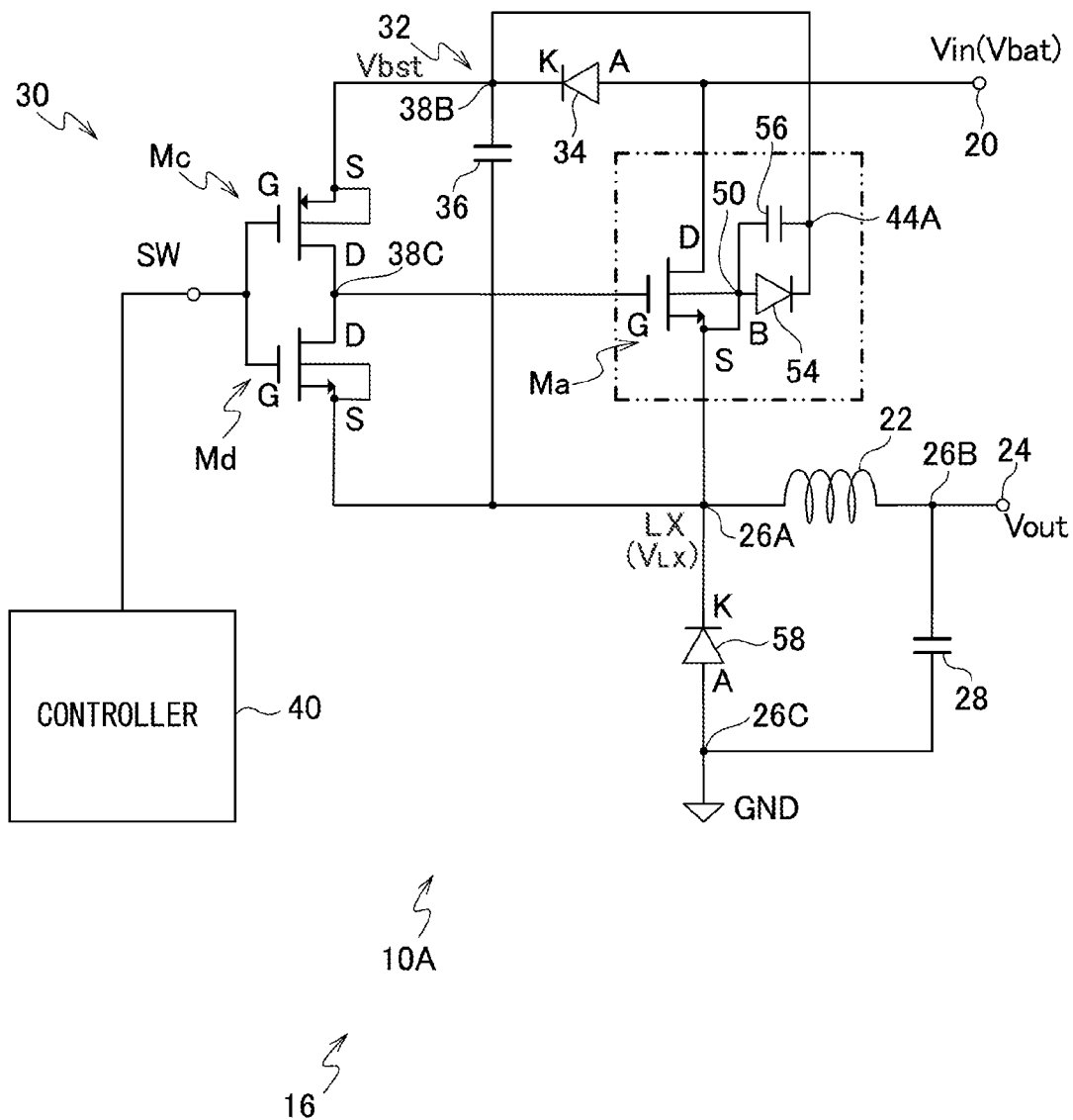
FIG. 4 is a circuit diagram of relevant portions illustrating another example of a step-down circuit according to the first exemplary embodiment.

A step-down circuit 10A illustrated in FIG. 4 employs a diode 58 as a synchronous rectification element in place of the transistor Mb. The anode A of the diode 58 is connected to the node 26C, and the cathode K thereof is connected to the LX node 26A. In the step-down circuit 10A, when the transistor Ma is driven ON, the voltage $V_{LX}$ of the LX node 26A rises to power supply voltage Vin. Moreover, in the step-down circuit 10A, when the transistor Ma is driven OFF, the voltage $V_{LX}$ of the LX node 26A falls to 0v, and current flows from the diode 58 towards the inductor 22. Consequently, in the step-down circuit 10A the power supply voltage Vin is stepped down, enabling the output voltage Vout to be output according to the power supply voltage Vin and the duty ratio of the switching signal SW.

Second Exemplary Embodiment

Explanation follows regarding a second exemplary embodiment of technology disclosed herein. Note that the basic configuration of the second exemplary embodiment is similar to that of the first exemplary embodiment, and so the same reference numerals are appended to functional components similar to those of the first exemplary embodiment, and explanation omitted thereof.

Figure 5:
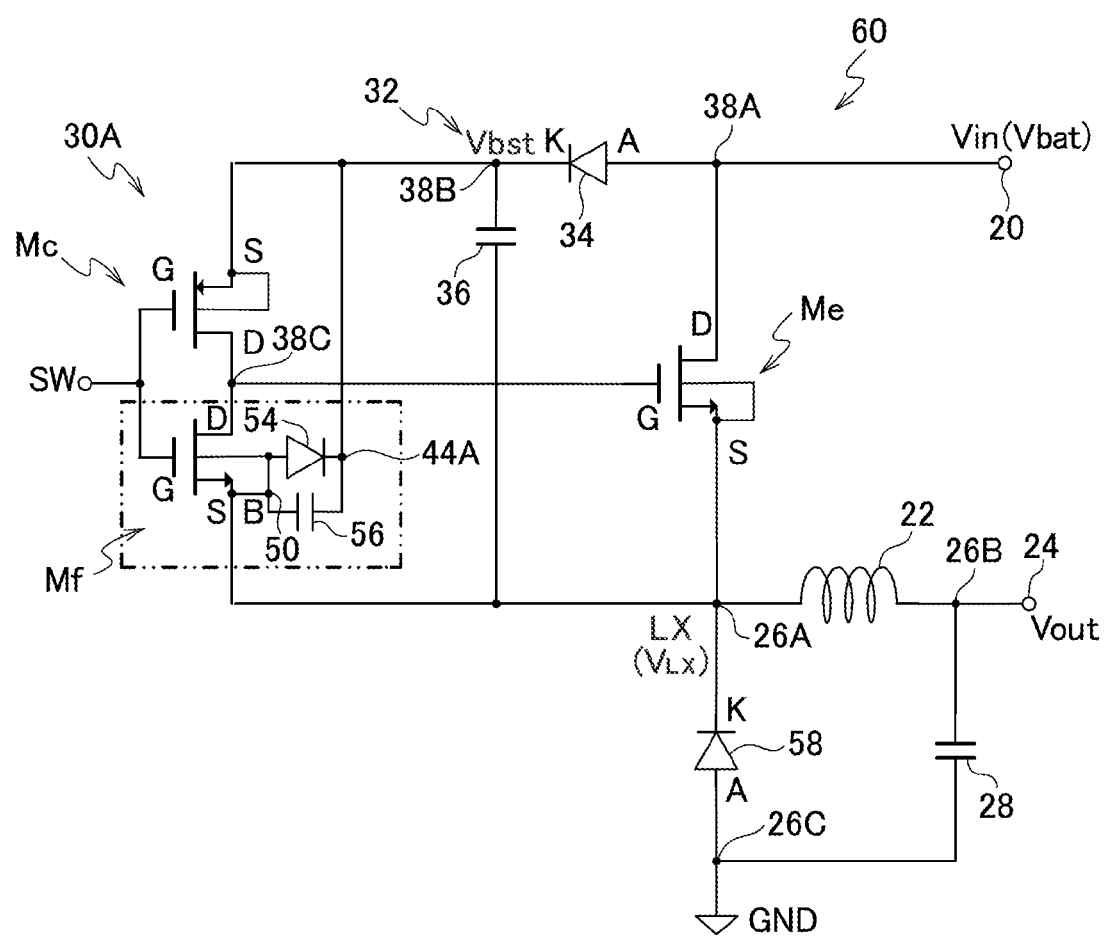
FIG. 5 is a circuit diagram illustrating relevant portions of a step-down circuit according to a second exemplary embodiment.

FIG. 5 illustrates a step-down circuit 60 according to a second exemplary embodiment. The step-down circuit 60 is provided to a DC-DC converter 16 in place of the step-down circuit 10, 10A. The step-down circuit 60 functions as an example of a power supply circuit of technology disclosed herein.

The step-down circuit 60 includes a transistor Me in place of the transistor Ma. The step-down circuit 60 includes a diode 58 as a synchronous rectification element. The step-down circuit 60 may be configured to employ a transistor Mb as a synchronous rectification element.

The step-down circuit 60 includes a driver circuit 30A and a bootstrap circuit 32. The bootstrap circuit 32 includes a diode 34 and a capacitor 36, and an electrostatic capacitance C bst is formed according to an electrostatic capacitance Co of the capacitor 36.

In the driver circuit 30A, a transistor Mf is employed in place of the transistor Md. In the second exemplary embodiment, the transistor Mf functions as an example of a semiconductor element. A triple-well structure nMOS transistor is employed as the transistor Mf. The transistors Mc, Mf function as an example of a pair of transistors of technology disclosed herein. The transistor Mf functions as an example of a semiconductor element in technology disclosed herein.

The drain D of the transistor Mf is connected to a node 38C, and the source S thereof is connected to an LX node 26A. A switching signal SW is respectively input to the gates G of the transistors Mc, Mf in the driver circuit 30A. The driver circuit 30A accordingly functions as an inverter, with the transistor Me ON/OFF driven according to the switching signal SW.

A p+ region 50 of the P well 46 is connected to the source S of the transistor Mf. In the step-down circuit 60 an n+ region 44A of an N well 44 of the transistor Mf is also connected to a node 38B.

In the step-down circuit 60, the electrical potential of the LX node 26A is always lower than the electrical potential of the node 38B, and in the step-down circuit 60 the capacitance 56 formed in the transistor Mf is hence in a parallel connected state to the capacitor 36 of the bootstrap circuit 32.

The step-down circuit 60 outputs a direct current output voltage Vout according to the power supply voltage Vin and the ON duty of the transistor Me by the transistor Me being rendered ON/OFF (switched) in response to the switching signal SW input to the driver circuit 30A.

Moreover, in the step-down circuit 60, due to the capacitance 56 of the transistor Mf being connected in parallel to the capacitor 36 of the bootstrap circuit 32, a lowering of the electrostatic capacitance Cbst, caused by floating capacitance attached to the gate G of the transistor Me, is suppressed Namely, in the step-down circuit 60, the transistor Mf provided to the driver circuit 30A is of a triple-well structure, and the n+ region 44A of the N well 44 of the transistor Mf is connected to the node 38B of the bootstrap circuit 32. Thus in the step-down circuit 60, the electrostatic capacitance Cjdnw of the capacitance 56 formed between the N well 44 and the P well 46 of the transistor Mf functions as part of the electrostatic capacitance Cbst of the bootstrap circuit 32.

Consequently, in the step-down circuit 60, the electrostatic capacitance Co of the capacitor 36 can be suppressed from becoming larger by securing the electrostatic capacitance Cbst of the bootstrap circuit 32 to prevent lowering of the voltage Vbst supplied to the driver circuit 30A. The step-down circuit 60 accordingly enables the capacitor 36 to be suppressed from becoming larger, and enables an increase in the surface area to be suppressed. The step-down circuit 60 enables lowering of the voltage Vbst to be suppressed, and so stabilizes operation of the transistor Me, and enables efficient voltage conversion to be achieved.

Third Exemplary Embodiment

Explanation follows regarding a third exemplary embodiment of technology disclosed herein. Note that the basic configuration of the third exemplary embodiment is similar to that of the first exemplary embodiment, and so the same reference numerals are appended in the third exemplary embodiment to functional components similar to those of the first and second exemplary embodiments, and explanation omitted thereof.

Figure 6:
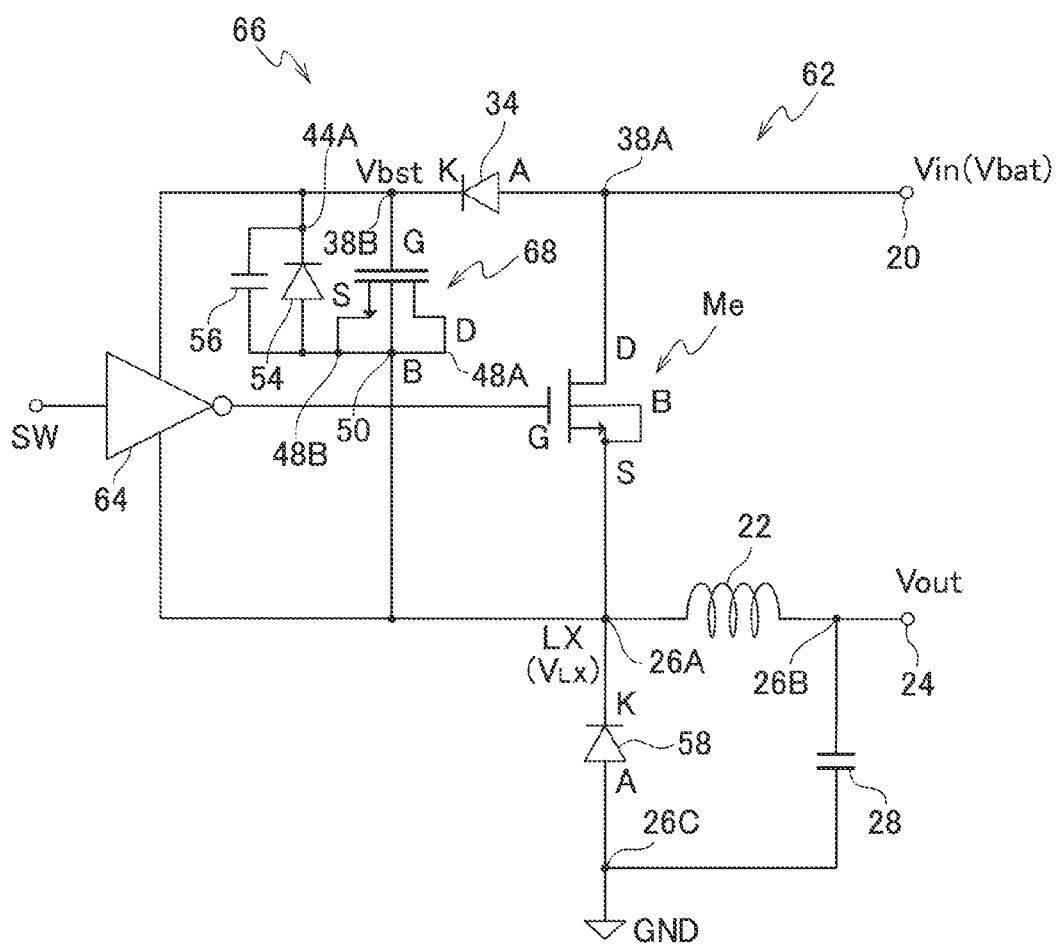
FIG. 6 is a circuit diagram illustrating relevant portions of a step-down circuit according to a third exemplary embodiment.

FIG. 6 illustrates a step-down circuit 62 according to the third exemplary embodiment. The step-down circuit 62 is provided to a DC-DC converter 16 in place of the step-down circuit 10. The step-down circuit 62 functions as an example of a power supply circuit of technology disclosed herein.

The step-down circuit 62 includes a transistor Me and a diode 58. The transistor Me functions as a main switch, and the diode 58 functions as a synchronous rectification element. The step-down circuit 62 also includes an inverter circuit 64 serving as a driver circuit that drives the transistor Me in place of the driver circuit 30. The inverter circuit 64 functions as an example of a driver circuit in the third exemplary embodiment.

In the step-down circuit 62 the transistor Me is ON/OFF driven according to a switching signal SW by inputting the switching signal SW to the inverter circuit 64. Note that the driver circuit 30 may be employed in the step-down circuit 62.

In the step-down circuit 62, a bootstrap circuit 66 is employed in place of the bootstrap circuit 32. The bootstrap circuit 66 includes a diode 34. The bootstrap circuit 66 also includes a MOS capacitor 68 in place of the capacitor 36. In the third exemplary embodiment, the bootstrap circuit 66 functions as an example of a bootstrap circuit. In the third exemplary embodiment, the MOS capacitor 68 functions as an example of a semiconductor element. In the third exemplary embodiment, the MOS capacitor 68 functions as an example of a capacitive element.

The MOS capacitor 68 is formed with a triple-well structure (see FIG. 3) in an IC 12 provided with the step-down circuit 62. Namely, the MOS capacitor 68 is formed with a N well 44 on a Psub 42. A P well 46 is formed in the N well 44, and the P well 46 is formed with a n+ region 48A corresponding to a drain D, a n+ region 48B corresponding to a source S, and a p+ region 50 corresponding to a back gate B. An electrode corresponding to a gate G is formed in the P well 46 between the n+ regions 48A, 48B (see FIG. 3).

The electrode corresponding to the gate G of the MOS capacitor 68 is connected to a node 38B. In the MOS capacitor 68, the n+ region 48A corresponding to the drain D, the n+ region 48B corresponding to the source S and the p+ region 50 corresponding to the back gate B are connected to an LX node 26A between the source S of the transistor Me and the cathode K of the diode 58.

Thus in the MOS capacitor 68, an electrostatic capacitance Co, formed by respective electrostatic capacitances between the gate G and the n+ region 48A, between the gate G and the n+ region 48B, and between the gate G and the back gate B p+ region 50, is employed to function as a capacitive element. Moreover, in the step-down circuit 62, the electrostatic capacitance Co of the MOS capacitor 68 functions as an electrostatic capacitance Cbst of the bootstrap circuit 66.

In the step-down circuit 62, the n+ region 44A of the N well 44 of the MOS capacitor 68 is connected to the node 38B. The step-down circuit 62 operates such that the electrical potential of the node 38B is always higher than the electrical potential of the LX node 26A.

Thus in the step-down circuit 62, a capacitance 56 between the N well 44 and the P well 46 is connected in parallel to the MOS capacitor 68 of the bootstrap circuit 66. Thus in the bootstrap circuit 66 the electrostatic capacitance Co due to the MOS capacitor 68 and the electrostatic capacitance Cjdnw of the capacitance 56 function as the electrostatic capacitance Cbst.

Thus in the step-down circuit 62, the electrostatic capacitance Co of the MOS capacitor 68 can be suppressed from becoming larger by securing the electrostatic capacitance Cbst of the bootstrap circuit 66 in order to prevent fall of the voltage Vbst supplied to the inverter circuit 64. The step-down circuit 62 accordingly enables enlargement of the MOS capacitor 68 to be suppressed, and enables an increase in the surface area to be suppressed. Moreover, the step-down circuit 62 stabilizes operation of the transistor Me and enhances the voltage conversion efficiency.

Fourth Exemplary Embodiment

Explanation follows regarding a fourth exemplary embodiment of technology disclosed herein. Note that the basic configuration of the fourth exemplary embodiment is similar to that of the first exemplary embodiment, and so in the fourth exemplary embodiment the same reference numerals are appended to functional components similar to those of the first to the third exemplary embodiments, and explanation omitted thereof.

Figure 7:
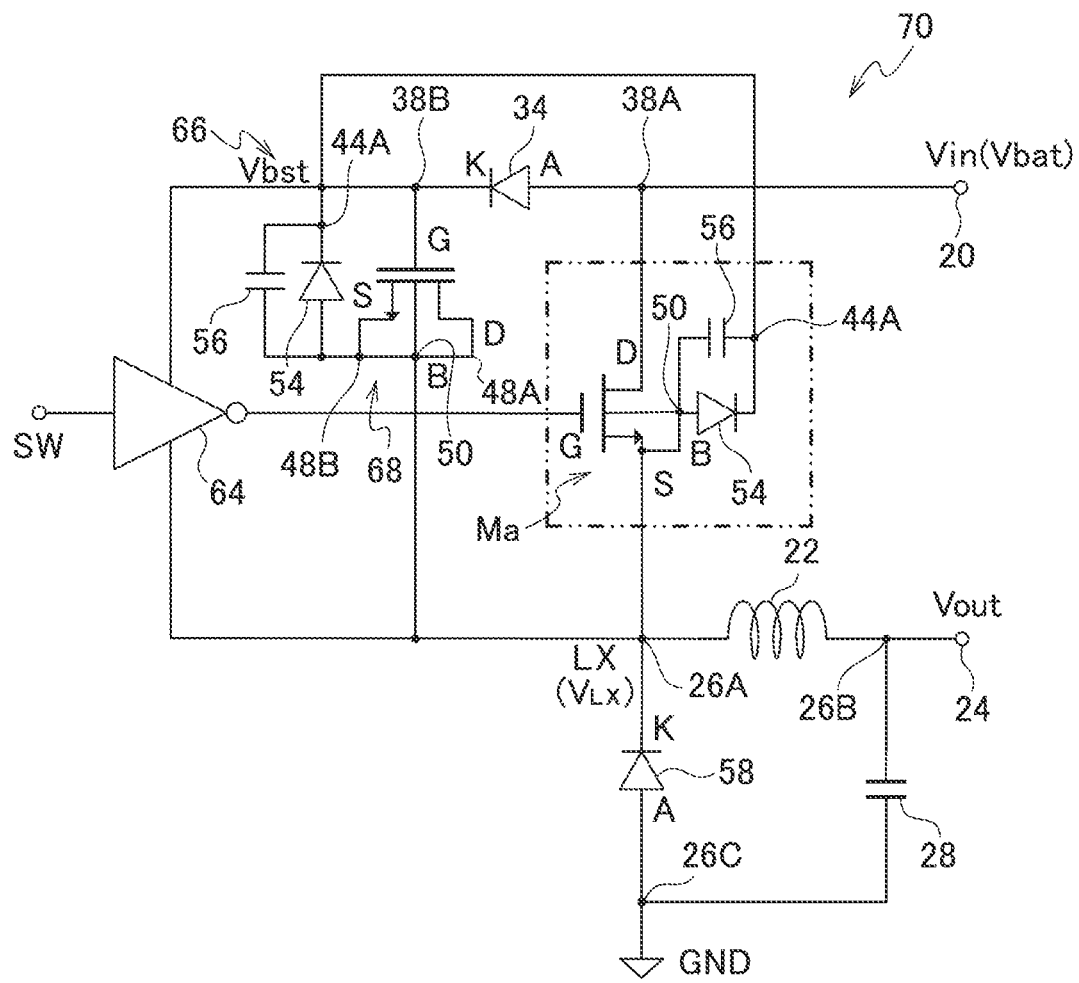
FIG. 7 is a circuit diagram illustrating relevant portions of a step-down circuit according to a fourth exemplary embodiment.

A step-down circuit 70 according to the fourth exemplary embodiment is illustrated in FIG. 7. The step-down circuit 70 is provided to a DC-DC converter 16 in place of the step-down circuit 10. The step-down circuit 70 functions as an example of a power supply circuit of technology disclosed herein.

The step-down circuit 70 includes a transistor Ma and a diode 58. The step-down circuit 70 includes an inverter circuit 64 and the bootstrap circuit 66. In the step-down circuit 70 the transistor Ma is accordingly ON/OFF driven according to a switching signal SW by inputting a switching signal SW to the inverter circuit 64. The step-down circuit 70 outputs a direct-current voltage output voltage Vout according to a power supply voltage Vin and the ON duty of the transistor Ma.

In the step-down circuit 70 a triple-well structure transistor Ma and an MOS capacitor 68 are employed. In the bootstrap circuit 66 an n+ region 44A of the N well 44 of the MOS capacitor 68 is connected to a node 38B, and an electrostatic capacitance Cjdnw arising in the MOS capacitor 68 as parasitic capacitance functions as an electrostatic capacitance Cbst of the bootstrap circuit 66.

In the step-down circuit 70, the electrostatic capacitance Cjdnw of the capacitance 56 formed in the transistor Ma is caused to function as the electrostatic capacitance Cbst of the bootstrap circuit 66 by connecting the n+ region 44A of the N well 44 of the transistor Ma to a node 38B.

Thus in the step-down circuit 70 the floating capacitance connected to a gate G of the transistor Ma is reduced, and the electrostatic capacitance Cjdnw arising as parasitic capacitance respectively in the transistor Ma and the MOS capacitor 68 is caused to function as the electrostatic capacitance Cbst.

Consequently, in the step-down circuit 70, the electrostatic capacitance Co of the MOS capacitor 68 can be suppressed from becoming larger by securing the electrostatic capacitance Cbst of the bootstrap circuit 66 to prevent fall of the voltage Vbst supplied to the inverter circuit 64. The step-down circuit 70 enables an increase in size of the MOS capacitor 68 to be prevented, thereby enabling an increase in the surface area to be suppressed. Moreover, in the step-down circuit 70, stabilization of the operation of the transistor Me is achieved, and a high voltage conversion efficiency is obtained.

Note that in the fourth exemplary embodiment, application is made to the step-down circuit 70 provided with the bootstrap circuit 66 including the MOS capacitor 68 and the transistor Ma, however the step-down circuit 70 may be configured to include the driver circuit 30A in place of the inverter circuit 64.

Figure 8:
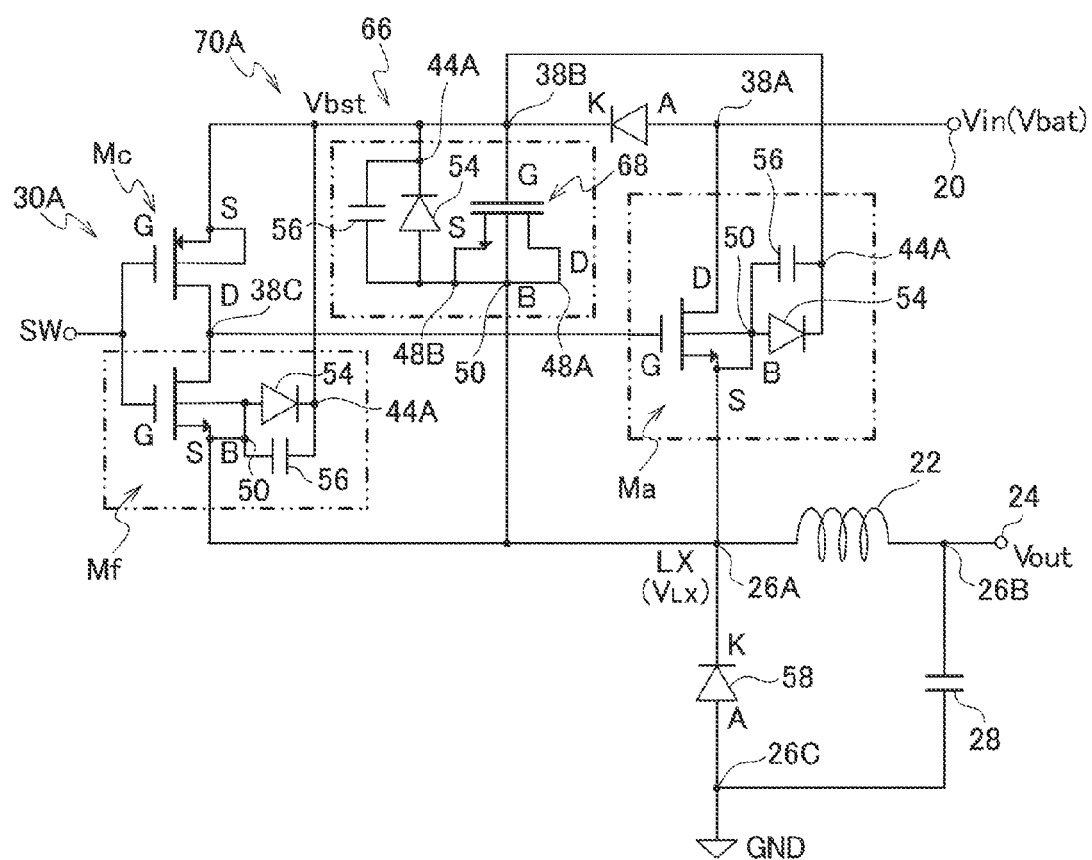
FIG. 8 is a circuit diagram illustrating relevant portions of another example of a step-down circuit according to the fourth exemplary embodiment.

FIG. 8 illustrates a step-down circuit 70A. The step-down circuit 70A includes a transistor Ma serving as a main switch, a bootstrap circuit 66 including a MOS capacitor 68, and a driver circuit 30A employing a transistor Mf. The transistors Ma, Mf and the MOS capacitor 68 are of triple-well structure. In the step-down circuit 70A, the transistors Ma, Mf and the respective N wells 44 of the transistors Ma, Mf and the MOS capacitor 68 (the n+ region 44A) are connected to the node 38B.

In the bootstrap circuit 66 provided to the step-down circuit 70A an electrostatic capacitance Cjdnw of each of the transistors Ma, Mf and the MOS capacitor 68 accordingly functions as an electrostatic capacitance Cbst.

Consequently, in the step-down circuit 70A the electrostatic capacitance Co of the MOS capacitor 68 can be suppressed from becoming larger by securing the electrostatic capacitance Cbst of the bootstrap circuit 66 in order to prevent fall of the voltage Vbst supplied to the driver circuit 30A. Moreover, the step-down circuit 70A enables the MOS capacitor 68 to be suppressed from becoming larger and enables an increase in the surface area to be suppressed. Moreover, the step-down circuit 70A achieves stable operation and a high voltage conversion efficiency can be obtained.

Fifth Exemplary Embodiment

Explanation follows regarding a fifth exemplary embodiment of technology disclosed herein. Note that the basic configuration of the fifth exemplary embodiment is similar to that of the first to the fourth exemplary embodiments, and so the same reference numerals are appended in the fifth exemplary embodiment to functional components similar to those of the first to the fourth exemplary embodiments, and explanation omitted thereof.

In the first to the fourth exemplary embodiments explanation has been given of examples of step-down circuits, however an example of a step-up circuit is explained in the fifth exemplary embodiment.

Figure 9:
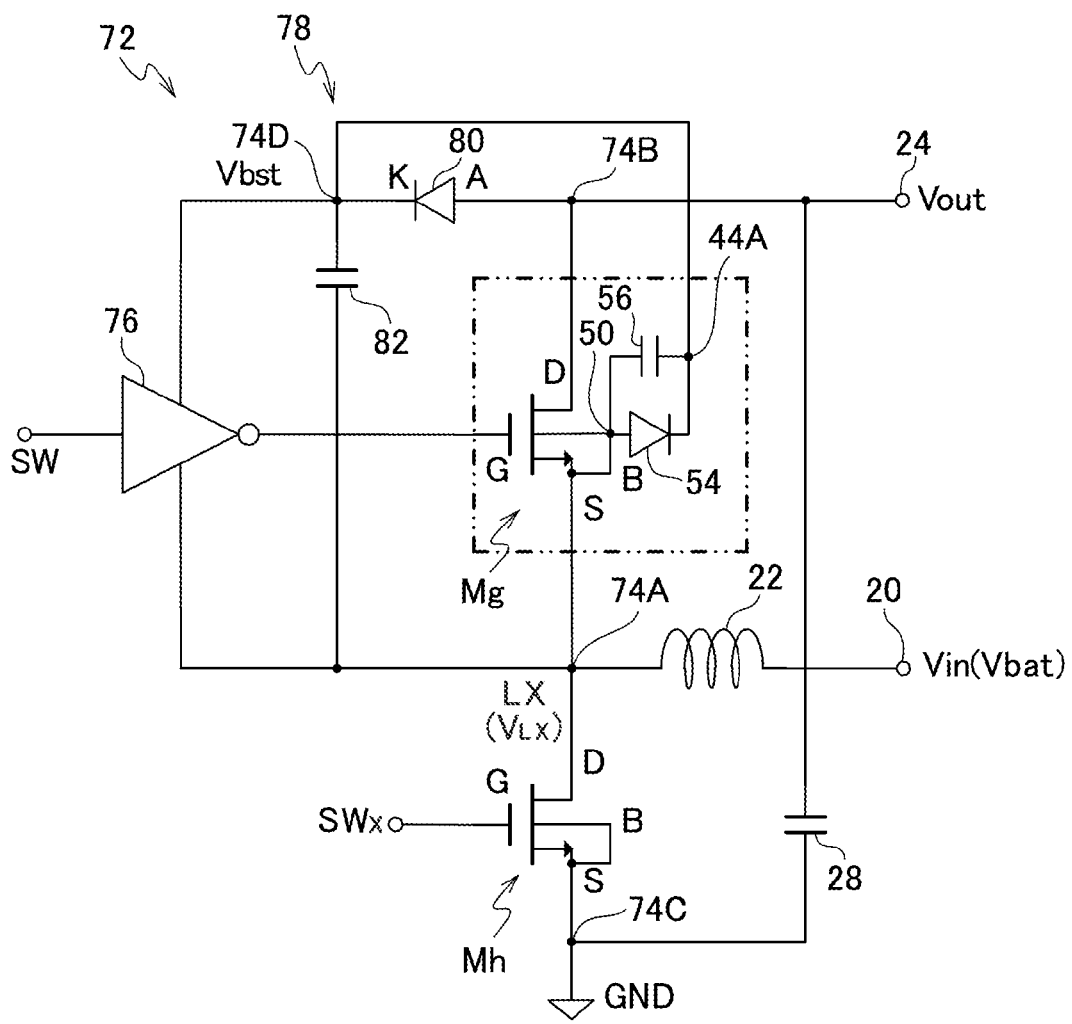
FIG. 9 is a circuit diagram illustrating relevant portions of a step-up circuit according to a fifth exemplary embodiment.

FIG. 9 illustrates a step-up circuit 72 according to a fifth exemplary embodiment. The step-up circuit 72 is provided to a DC-DC converter 16, and, on input with a power supply voltage Vin such as a battery voltage Vbat, outputs an output voltage Vout stepped-up from the power supply voltage Vin. The step-up circuit 72 functions as an example of a power supply circuit of technology disclosed herein.

The step-up circuit 72 includes transistors Mg, Mh. The transistors Mg, Mh employ nMOS transistors. In the step-up circuit 72, the transistor Mg functions as a synchronous rectification element, and the transistor Mh functions as a main switch. In the fifth exemplary embodiment, the transistor Mg functions as an example of a switching element. In the fifth exemplary embodiment, the transistor Mg functions as an example of a switching element provided as a synchronous rectification element. Moreover, in the fifth exemplary embodiment, the transistor Mh functions as an example of a step-up switching element.

In the transistor Mh the drain D is connected to an LX node 74A, and the source S is connected to ground. In the step-up circuit 72, one end of an inductor 22 is connected to the LX node 74A, and the other end of the inductor 22 is connected to an input terminal 20. In the fifth exemplary embodiment, the LX node 74A functions as an example of a first node.

In the transistor Mg the source S is connected to the LX node 74A, and the drain D is connected to a node 74B. In the step-up circuit 72 an output terminal 24 is connected to the node 74B. Moreover, the step-up circuit 72 includes a capacitor 28. One end of the capacitor 28 is connected to the output terminal 24 (the node 74B) and the other end is connected to ground by connection to the source S of the transistor Mh at a node 74C.

Moreover, the step-up circuit 72 also includes an inverter circuit 76 and a bootstrap circuit 78. The bootstrap circuit 78 includes a diode 80 and a capacitor 82. The bootstrap circuit 78 functions as an example of a bootstrap circuit of technology disclosed herein. The diode 80 functions as an example of a rectifier element of technology disclosed herein, and the capacitor 82 functions as an example of a capacitive element of technology disclosed herein.

The anode A of the diode 80 is connected to the node 74B and the cathode K is connected to a node 74D. One end of the capacitor 82 is connected to the node 74D, and the other end is connected to the LX node 74A. The node 74D functions as an example of a second node according to the technology disclosed herein.

The inverter circuit 76 functions as an example of a driver circuit of technology disclosed herein. The inverter circuit 76 is supplied with a voltage Vbst of the node 74D of the bootstrap circuit 78. The step-up circuit 72 is also input with a switching signal SW to the inverter circuit 76.

The step-up circuit 72 outputs the voltage V bst supplied from the bootstrap circuit 78 to the gate G of the transistor Mg when input with a L level signal as the switching signal SW to the inverter circuit 76. The transistor Mg is ON operated by input of the voltage V bst from the inverter circuit 76 to the gate G.

In the step-up circuit 72 a switching signal SWx is input to the gate G of the transistor Mh. The transistor Mh is ON operated by input of the switching signal SWx at H level. Note that in the step-up circuit 72, due to driving the transistor Mg with the inverter circuit 76, the transistor Mg is ON operated when the transistor Mh is OFF operated, and the transistor Mg is OFF operated when the transistor Mh is operated ON.

In the step-up circuit 72 the transistor Mg is made OFF by making the switching signal SW H level, and the transistor Mh is made ON by the switching signal SWx. Current accordingly flows from the input terminal 20 under the power supply voltage Vin to the transistor Mh, and energy is accumulated in the inductor 22.

Moreover, in the step-up circuit 72, the transistor Mh is made OFF by making the switching signal SWx L level, and the transistor Mg is made ON in response to the switching signal SW. In the step-up circuit 72, current flows from the inductor 22 to the transistor Mg due to the energy accumulated in the inductor 22 by making the transistor Mh OFF and the transistor Mg ON, thereby charging the capacitor 28. The bootstrap circuit 78 supplies the voltage V bst according to the charging amount of the bootstrap circuit 78 to the inverter circuit 76 and the transistor Mg is driven by the voltage V bst.

The step-up circuit 72 outputs as the output voltage Vout from the output terminal 24 a voltage according to the charging amount of the capacitor 28. When this is performed, in the step-up circuit 72 the power supply voltage Vin is stepped up according to the ON duty of the transistor Mh by the switching signal SW, and output as the output voltage Vout.

In the step-up circuit 72, the floating capacitance attached to the gate G of the transistor Mg causes a reduction (drop) in the electrostatic capacitance Cbst of the bootstrap circuit 78. The drop in the electrostatic capacitance Cbst of the bootstrap circuit 78 causes a drop in the voltage Vbst the bootstrap circuit 78 supplies to the inverter circuit 76.

However, in the step-up circuit 72, the triple-well structure nMOS transistor is employed as the transistor Mg. In the transistor Mg the back gate B (the p+ region 50 of the P well 46) is connected to the source S, and the n+ region 44A of the N well 44 is connected to the node 74D of the bootstrap circuit 78.

In the step-up circuit 72, the electrical potential of the node 74D is held at a higher electrical potential than the electrical potential of the LX node 74A (the source S of the transistor Mg) by charging of the capacitor 82. Thus in the bootstrap circuit 78, the capacitance 56 of the transistor Mg is connected in parallel to the capacitor 82. In the bootstrap circuit 78 the electrostatic capacitance Cjdnw arising as parasitic capacitance in the transistor Mg accordingly functions as part of the electrostatic capacitance Cbst of the bootstrap circuit 78 due to the capacitance 56 of the transistor Mg being connected in parallel to the capacitor 82.

In the step-up circuit 72 the floating capacitance attached to the gate G of the transistor Mg is accordingly reduced, and moreover a drop in the voltage Vbst caused by floating capacitance is suppressed.

Consequently, the step-up circuit 72 is able to achieve a smaller capacitor 82 to obtain the electrostatic capacitance Cbst needed in the step-up circuit 72, and the step-up circuit 72 stabilizes the operation of the transistor Mg. Moreover, the step-up circuit 72 enables efficient voltage conversion to be performed.

Note that the inverter circuit 76 and the capacitor 82 are employed in the step-up circuit 72, however the driver circuit 30A may be employed in place of the inverter circuit 76, or the MOS capacitor 68 may be employed in place of the capacitor 82.

Sixth Exemplary Embodiment

Explanation follows regarding a sixth exemplary embodiment of technology disclosed herein. Note that in the sixth exemplary embodiment, functional components similar to those of the first to the fifth exemplary embodiments are appended the same reference numerals as in the first to the fifth exemplary embodiments, and explanation omitted thereof.

In the first to the fourth exemplary embodiments, explanation has been given of examples of step-down circuits, and in the fifth exemplary embodiment explanation has been given of a step-up circuit. In the sixth exemplary embodiment explanation follows of an example of a step-up/down circuit.

Figure 10:
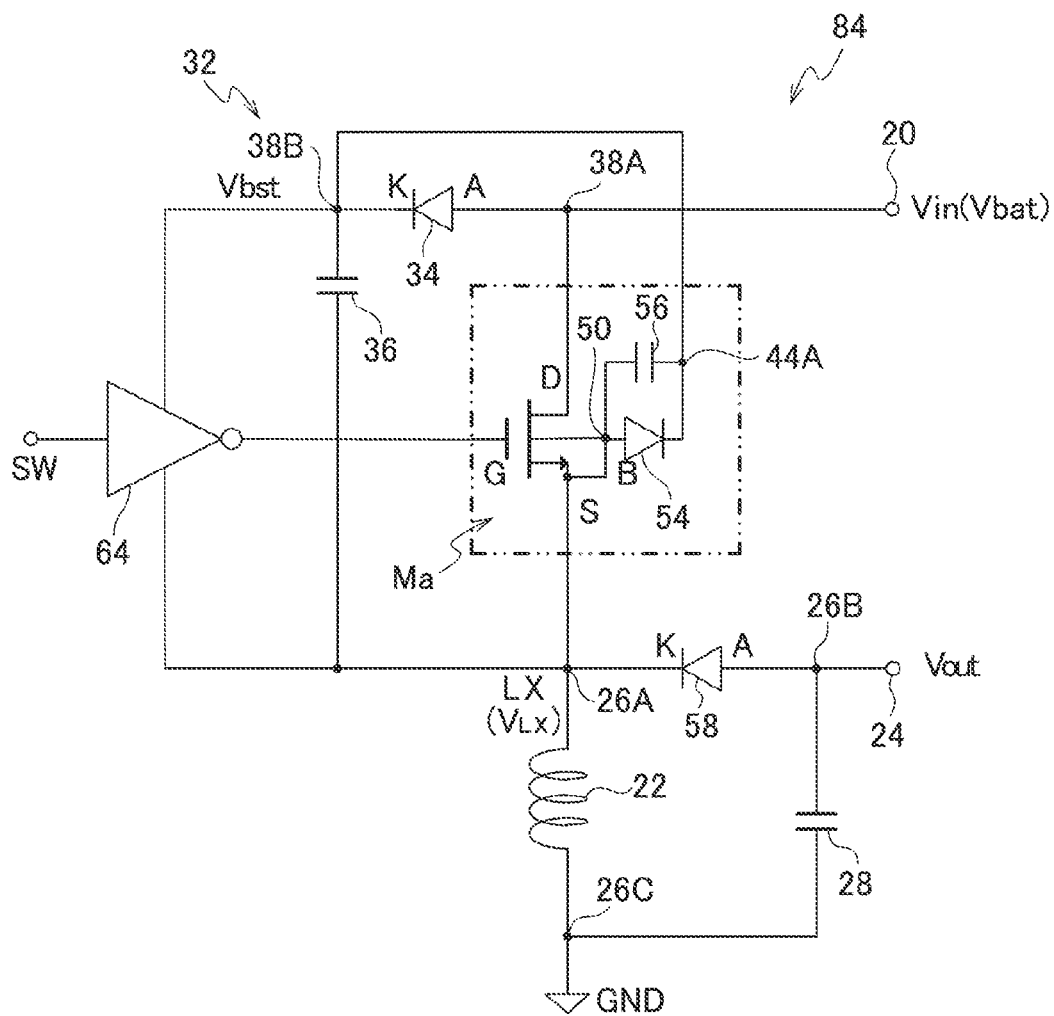
FIG. 10 is a circuit diagram illustrating relevant portions of a step-up and step-down circuit according to a sixth exemplary embodiment.

A step-up/down circuit 84 according to a sixth exemplary embodiment is illustrated in FIG. 10. The step-up/down circuit 84 is provided to a DC-DC converter 16, and outputs an output voltage V out on input with a power supply voltage Vin such as a battery voltage Vbat. The step-up/down circuit 84 functions as an example of a power supply circuit according to technology disclosed herein.

The step-up/down circuit 84 includes a transistor Ma, an inverter circuit 64 that drives the transistor Ma according to a switching signal SW, and a bootstrap circuit 32. The step-up/down circuit 84 includes an inductor 22, a capacitor 28 and a diode 58.

In the step-up/down circuit 84 the capacitor 28 is connected to a node 26B and a node 26C, one end of the inductor 22 is connected to a LX node 26A, and the other end of the inductor 22 is connected to ground by connection to the node 26C. In the step-up/down circuit 84 the anode A of the diode 58 is connected to the node 26B, and the cathode K of the diode 58 is connected to the LX node 26A.

The step-up/down circuit 84 outputs a negative output voltage Vout from an output terminal 24 on input with a positive power supply voltage Vin from an input terminal 20. The step-up/down circuit 84 functions as an inverting DC-DC converter. Namely, in the step-up/down circuit 84 current flows in the inductor 22 and energy is accumulated when the switching signal SW is at L level and the transistor Ma is ON. Moreover, in the step-up/down circuit 84, when the switching signal SW is H level and the transistor Ma is OFF, electromotive force arises due to energy accumulated in the inductor 22, and current flows from the output terminal 24 towards the inductor 22. The capacitor 28 in the step-up/down circuit 84 is charged when this occurs such that the output terminal 24 has a negative voltage with respect to GND.

Due to this, the step-up/down circuit 84 outputs a negative output voltage Vout corresponding to the charged voltage of the capacitor 28 from the output terminal 24. When doing so, the step-up/down circuit 84 outputs an output voltage Vout with an absolute value according to the power supply voltage Vin and the ON duty of the transistor Ma.

The step-up/down circuit 84 employs the transistor Ma with a triple-well structure. In the step-up/down circuit 84, a back gate B of the transistor Ma (a p+ region 50 of the P well 46) is connected to the source S, and an n+ region 44A of a N well 44 is connected to a node 38B of a bootstrap circuit 32. Moreover, in the step-up/down circuit 84, the electrical potential of the node 38B is held at a higher electrical potential than the electrical potential of the LX node 26A (the source S of the transistor Ma) by charging of the capacitor 36.

Thus in the step-up/down circuit 84 electrostatic capacitance Cjdnw arising as parasitic capacitance in the transistor Ma functions as the electrostatic capacitance Cbst of the bootstrap circuit 32. In the step-up/down circuit 84, the floating capacitance attached to the gate G of the transistor Ma is reduced by the electrostatic capacitance Cjdnw functioning as the electrostatic capacitance Cbst, and moreover enabling lowering of the voltage Vbst caused by floating capacitance to be suppressed.

Consequently, in the step-up/down circuit 84, a smaller capacitor 36 can be achieved to obtain the electrostatic capacitance Cbst needed in the bootstrap circuit 32. Moreover, the step-up/down circuit 84 stabilizes operation of the transistor Ma. The step-up/down circuit 84 also enables efficient voltage conversion to be performed.

Note that although in the step-up/down circuit 84 the capacitor 36 and the inverter circuit 64 are employed, an MOS capacitor 68 may be employed in place of the capacitor 36, or a driver circuit 30A may be employed in place of the inverter circuit 68.

Seventh Exemplary Embodiment

Explanation follows regarding a seventh exemplary embodiment of technology disclosed herein. Note that in the seventh exemplary embodiment, the same reference numerals are appended to functional components similar to those of the first to the sixth exemplary embodiments as in the first to the sixth exemplary embodiments, and explanation omitted thereof.

Figure 11:
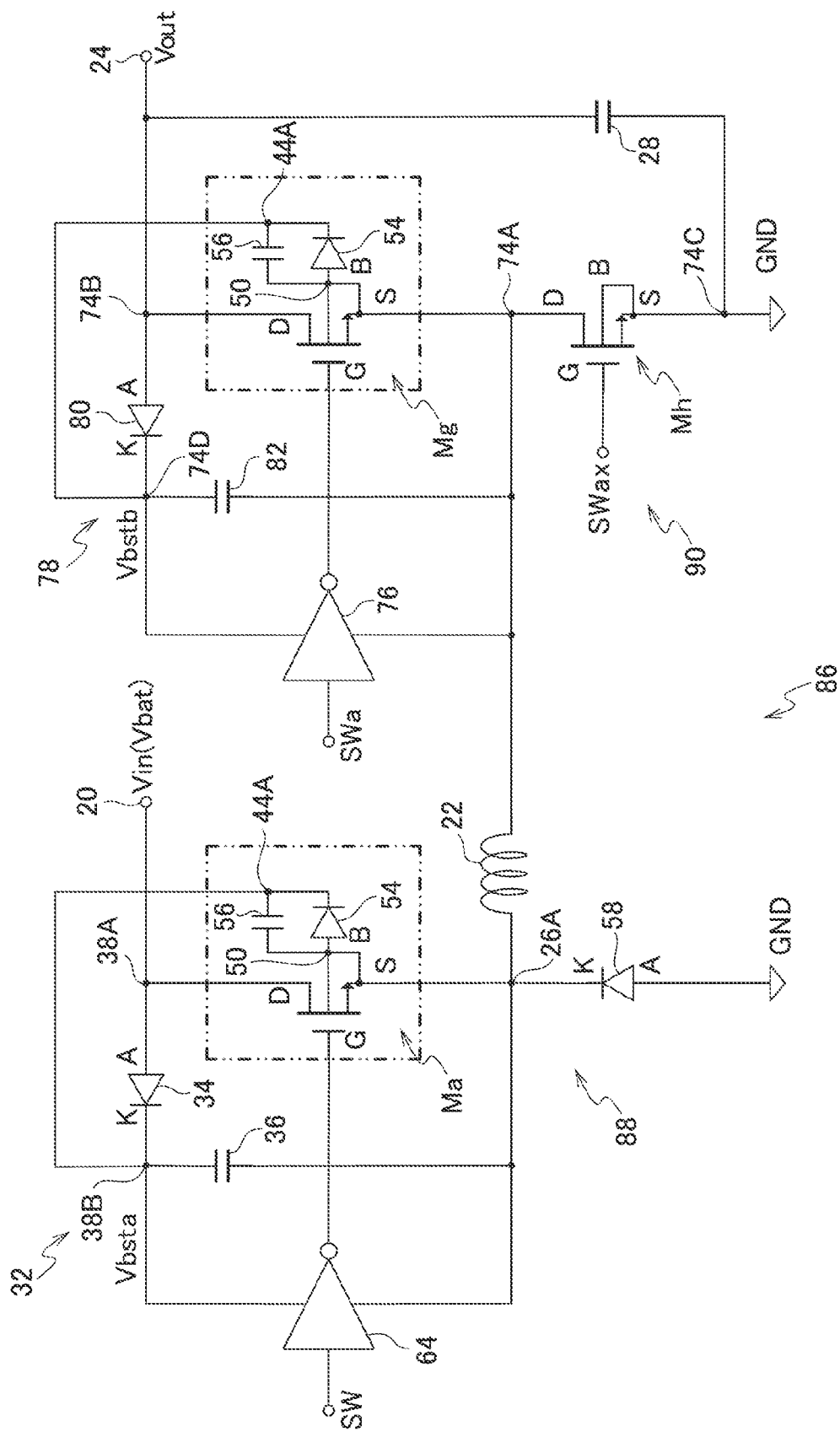
FIG. 11 is a circuit diagram illustrating relevant portions of a step-up and step-down circuit according to a seventh exemplary embodiment.

A step-up/down circuit 86 according to the seventh exemplary embodiment is illustrated in FIG. 11. The step-up/down circuit 86 is provided to the DC-DC converter 16, and the output voltage Vout is output on input with the power supply voltage Vin. The step-up/down circuit 86 functions as an example of a power supply circuit of technology disclosed herein.

The step-up/down circuit 86 includes a step-down section 88 and a step-up section 90. In the seventh exemplary embodiment, the step-down section 88 functions as a first circuit and the step-up section 90 functions as a second circuit. The step-down section 88 includes a transistor Ma that functions as a main switch and a diode 58 that functions as a synchronous rectification element. The step-down section 88 includes the bootstrap circuit 32 and the inverter circuit 64.

In the seventh exemplary embodiment, the transistor Ma functions as an example of a semiconductor element. Moreover, in the seventh exemplary embodiment, the transistor Ma functions as an example of a switching element, and the diode 58 functions as an example of a synchronous rectification element. Moreover, in the seventh exemplary embodiment the bootstrap circuit 32 functions as an example of a bootstrap circuit and the inverter circuit 64 functions as an example of a driver circuit.

Note that in the step-down section 88 the transistor Mb may be employed in place of the diode 58. In the step-down section 88 the bootstrap circuit 66 may be employed in place of the bootstrap circuit 32. Moreover, in the step-down section 88 the driver circuit 30 or the driver circuit 30A may be employed in place of the inverter circuit 64.

The inverter circuit 64, on input of a switching signal SW, ON/OFF drives the transistor Ma according to the switching signal SW, and the bootstrap circuit 32 supplies a voltage (voltage Vbsta) for driving the transistor Ma to the inverter circuit 64.

The step-up section 90 includes transistors Mg, Mh. In the seventh exemplary embodiment, the transistor Mh functions as an example of a step-up switching element. The transistor Mh also functions as a main switch, and is ON/OFF driven by input of a switching signal SWa according to the switching signal SW. The transistor Mg functions as a synchronous rectification element. The step-up section 90 includes an inverter circuit 76 and a bootstrap circuit 78.

In the seventh exemplary embodiment, the transistor Mg functions as an example of a semiconductor element. Moreover, in the seventh exemplary embodiment, the transistor Mg functions as an example of a switching element provided as a synchronous rectification element. In the seventh exemplary embodiment, the inverter circuit 76 functions as an example of a driver circuit, and the bootstrap circuit 78 functions as an example of a bootstrap circuit. Moreover, in the seventh exemplary embodiment, the LX node 74A in the step-up section 90 functions as an example of a first node, and the node 74D functions as an example of a second node.

Note that in the step-up section 90, the bootstrap circuit 66 may be employed in place of the bootstrap circuit 78. Moreover, in the step-up section 90 the driver circuit 30 or the driver circuit 30A may be employed in place of the inverter circuit 76.

In the inverter circuit 76, by input of a switching signal SW, the transistor Mg is ON/OFF driven according to the switching signal SW. In the bootstrap circuit 78, a voltage (voltage Vbstb) for driving the transistor Mg is supplied to the inverter circuit 76.

The step-up/down circuit 86 includes an inductor 22 and a capacitor 28. One end of the inductor 22 is connected to a LX node 26A of the step-down section 88, and the other end thereof is connected to a LX node 74A of the step-up section 90. One end of the capacitor 28 is connected to an output terminal 24 (a node 74B), and the other end thereof is connected to ground by connecting to a node 74C at the source S side of the transistor Mh.

In the step-up/down circuit 86, a switching signal SWa, that is complementary to the switching signal SW input to the inverter circuit 64 of the step-down section 88, is input to the inverter circuit 76 of the step-up section 90. In the step-up/down circuit 86, a switching signal SWax according to the switching signal SWa (for example SWa=SWax) is input to the transistor Mh. The step-up/down circuit 86 accordingly functions as an H bridge DC-DC converter.

In the step-up/down circuit 86 the transistor Ma is made ON by the switching signal SW becoming L level. When this occurs, in the step-up/down circuit 86 the switching signals SWa, SWax become H level, the transistor Mg is switched OFF and the transistor Mh is switched ON. In the step up/down circuit 86, the transistor Ma is switched OFF by the switching signal SW becoming H level. In the step-up/down circuit 86, the switching signals SWa, SWax become L level, the transistor Mg is switched ON, and the transistor Mh is switched OFF. Moreover, in the step-up/down circuit 86 a capacitor 36 of the bootstrap circuit 32 of the step-down section 88 is charged by the power supply voltage Vin.

In the step-up/down circuit 86, current flows from the step-down section 88 towards the step-up section 90 due to the transistor Ma being ON and the transistor Mh being ON, and energy is accumulated in the inductor 22. Then, in the step-up/down circuit 86, electromotive force arises due to the energy stored in the inductor 22, and a current flows from the diode 58 towards the transistor Mg when the transistors Ma, Mh are OFF and the transistor Mg is ON. Thus in the step-up/down circuit 86, the capacitor 28 of the step-up section 90 is charged, and the capacitor 82 of the bootstrap circuit 78 of the step-up section 90 is also charged. In the step-up/down circuit 86, a direct-current voltage according to the charged voltage of the capacitor 28 is output from the output terminal 24 as output voltage Vout.

Moreover, in the step-up/down circuit 86, the transistor Ma is in an ON state while the switching signal SW input to the inverter circuit 64 of the step-down section 88 is held at L level. In the step-up/down circuit 86, the diode 58 is provided as a synchronous rectification element, and when the transistor Ma adopts an ON state an input voltage Vin is applied to the LX node 26A of the step-down section 88 to which the inductor 22 is connected. The step-up/down circuit 86 accordingly functions as a step-up DC-DC inverter (see FIG. 9) and the step-up section 90 outputs the power supply voltage Vin input through the inductor 22 stepped-up according to the switching signals SWa, SWax.

Moreover, in the step-up/down circuit 86, the transistor Mg adopts an ON state and the transistor Mh adopts an OFF state while the switching signal SWa input to the inverter circuit 76 of the step-up section 90, and the switching signal SWax input to the transistor Mh are held at L level. In the step-up/down circuit 86, the voltage output from the step-down section 88 through the inductor 22 is output from the output terminal 24 of the step-up section 90 when the transistor Mg of the step-up section 90 adopts an ON state and the transistor Mh adopts an OFF state. The step-up/down circuit 86 accordingly functions as a step-down DC-DC inverter (see FIG. 4), and the step-down section 88 outputs power supply voltage Vin stepped-down according to the switching signal SW.

Triple-well structure nMOS transistors are employed in the step-up/down circuit 86 as the transistor Ma of the step-down section 88 and the transistor Mg of the step-up section 90. In the step-down section 88 of the step-up/down circuit 86, the back gate B of the transistor Ma (a p+ region 50 of a P well 46) is connected to the source S, and a n+ region 44A of the N well 44 is connected to a node 38B of the bootstrap circuit 32. Moreover, in the step-down section 88 of the step-up/down circuit 86, due to charging of the capacitor 36, the electrical potential of the node 38B is held at a higher electrical potential than the electrical potential of the LX node 26A (the source S of the transistor Ma).

Thus in the step-down section 88 of the step-up/down circuit 86, the electrostatic capacitance Cjdnw arising as parasitic capacitance in the transistor Ma functions as electrostatic capacitance Cbsta of the bootstrap circuit 32. In the step-up/down circuit 86, the floating capacitance attached to the gate G of the transistor Ma is reduced by the electrostatic capacitance Cjdnw functioning as the electrostatic capacitance Cbsta, thereby enabling lowering of the voltage Vbsta caused by floating capacitance to be suppressed.

In the step-up section 90 of the step-up/down circuit 86, the back gate B of the transistor Mg (the p+ region 50 of the P well 46) is connected to the source S, and the n+ region 44A of the N well 44 is connected to the node 74D of the bootstrap circuit 78. In the step-up section 90 of the step-up/down circuit 86, the electrical potential of the node 74D is held at a higher electrical potential than the electrical potential of the LX node 74A (the source S of the transistor Mg) by charging of the capacitor 82.

Accordingly, in the step-up section 90 of the step-up/down circuit 86, the electrostatic capacitance Cjdnw arising as parasitic capacitance in the transistor Mg functions as the electrostatic capacitance Cbstb of the bootstrap circuit 78. In the step-up/down circuit 86, the floating capacitance attached to the gate G of the transistor Mg is reduced due to the electrostatic capacitance Cjdnw functioning as the electrostatic capacitance Cbstb, enabling lowering of the voltage Vbstb caused by floating capacitance to be further suppressed.

Consequently, in the step-up/down circuit 86, smaller capacitors 36, 82 can be employed to obtain the electrostatic capacitance Cbsta, Cbstb needed in the bootstrap circuits 32, 78. Moreover, in the step-up/down circuit 86, stabilization is achieved of the operation of the transistors Ma, Mg. The step-up/down circuit 86 also enables efficient voltage conversion to be performed.

The technology disclosed herein includes semiconductor integrated circuits formed using Silicon On Insulator (SOI) technology to form an insulating film such as silicon dioxide ($SiO_2$) on a substrate (wafer) such as the Psub 42.

An aspect of the technology disclosed herein has the advantageous effect that a smaller capacitive element can be achieve by employing parasitic capacitance of a semiconductor element of so-called triple-well structure as the electrostatic capacitance of the capacitive element on a circuit.

The technology disclosed herein is not limited to the exemplary embodiments described above, and embodiments may be employed if each section includes functions that are the object of the each section. Moreover, all cited documents, patent applications and technical standards mentioned in the present specification are incorporated by reference in the present specification to the same extent as if the individual cited documents, patent applications and technical standards were specifically and individually incorporated by reference in the present specification.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor integrated circuit comprising:
a capacitive element that has a first end connected to a first node and a second end connected to a second node of higher electrical potential than the first node; and
a semiconductor element that has a source electrode, a drain electrode and a gate electrode respectively formed in a second conducting region, the second conducting region being formed with a different conducting type to a first conducting region, and the first conducting region formed on a substrate, with the source electrode and the second conducting region connected to the first node, and the first conducting region connected to the second node, wherein a conducting type of one of the first conducting region and the second conducting region is N-well, and a conducting type of another of the first conducting region and the second conducting region is P-well.

2. The semiconductor integrated circuit of claim 1, wherein the capacitive element is formed with the source electrode, the drain electrode and the first conducting region of the semiconductor element connected to the first node, and the gate electrode of the semiconductor element connected to the second node.

3. A semiconductor integrated circuit comprising:

a first terminal connected to a first end of a capacitive element;

a second terminal connected to a second end of the capacitive element at a higher electrical potential than the first terminal;

a semiconductor element that has a source electrode, a drain electrode and a gate electrode respectively formed in a second conducting region, the second conducting region being formed with a different conducting type to a first conducting region, and the first conducting region formed on a substrate, with the source electrode and the second conducting region connected to the first terminal, and the first conducting region connected to the second terminal, wherein a conducting type of one of the first conducting region and the second conducting region is N-well, and a conducting type of another of the first conducting region and the second conducting region is P-well.

* * * * *